US006743069B2

(12) United States Patent
Palanisamy

(10) Patent No.: US 6,743,069 B2
(45) Date of Patent: Jun. 1, 2004

(54) FACILITATING THE SPREAD OF ENCAPSULANT BETWEEN SURFACES OF ELECTRONIC DEVICES

(75) Inventor: Ponnusamy Palanisamy, Lansdale, PA (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 09/904,239

(22) Filed: Jul. 12, 2001

(65) Prior Publication Data

US 2003/0011302 A1 Jan. 16, 2003

(51) Int. Cl.[7] .................................................. H01J 9/00
(52) U.S. Cl. ..................... 445/25; 445/24; 257/433; 257/667; 438/26; 438/28; 438/126; 438/127; 264/272.11; 156/145
(58) Field of Search .............................. 438/25, 26, 28, 438/106, 116, 125–127; 445/24, 25; 156/145; 264/272.11; 313/512, 506, 507, 508, 509; 257/433, 667

(56) References Cited

U.S. PATENT DOCUMENTS

| 4,713,579 | A | * | 12/1987 | Miura ......................... 313/500 |
| 5,427,858 | A | * | 6/1995 | Nakamura et al. ........... 428/421 |
| 6,476,783 | B2 | * | 11/2002 | Matthies et al. .............. 345/82 |
| 6,492,251 | B1 | * | 12/2002 | Haba et al. .................. 438/612 |

FOREIGN PATENT DOCUMENTS

| DE | 19833039 | * | 1/2000 | ........... H01L/33/00 |
| JP | 2000-012581 | * | 1/2000 | ........... H01L/21/56 |

* cited by examiner

Primary Examiner—Nimeshkumar D. Patel
Assistant Examiner—Mariceli Santiago
(74) Attorney, Agent, or Firm—Trop, Pruner & Hu, P.C.

(57) ABSTRACT

An electronic device having an extensive narrow passageway may be effectively encapsulated by forming openings in one or more of the surfaces defining the encapsulation region. Encapsulation material may then be injected through these openings to fill a narrow, difficult to access region between two surfaces being encapsulated. In some cases, the encapsulant may be applied progressively, starting with a central port and applying the encapsulant in a radially expanding front through radially displaced ports.

13 Claims, 2 Drawing Sheets

FACILITATING THE SPREAD OF ENCAPSULANT BETWEEN SURFACES OF ELECTRONIC DEVICES

BACKGROUND

This invention relates generally to the manufacture of electronic devices, including electronic displays, and particularly the encapsulation of such devices.

The encapsulation of electronic devices may involve the use of a viscous liquid material such a epoxy which is applied into voids and open areas within electronic devices. In some cases, the encapsulation prevents attack from contaminants such as water and air. In addition, encapsulation sometimes increases the structural integrity of the electronic device. For these and other reasons, it is often desirable to apply encapsulation material to electronic devices.

In a variety of circumstances, the area to be encapsulated may involve a relatively narrow region between surfaces of electronic devices. Examples of such situations are the encapsulation of an integrated circuit chip onto a printed circuit board and the encapsulation between panels in electronic display devices. In each case, a narrow, planar region must be encapsulated. However, the encapsulation material is generally somewhat viscous. Because of the intrusion of electronic devices into the encapsulation region or because of its narrowness, it may be difficult to provide an encapsulation source inwardly into the narrow region.

Given the narrowness of the encapsulation region, two problems may arise. Firstly, it may take an excessively long time to cause encapsulation to occur. With conventional techniques, beads of encapsulation are applied around the edges of the narrow region to be encapsulated. Capillary forces are then relied upon to draw the encapsulant inwardly into the encapsulated region. In some cases, the encapsulation material is only applied on two of four edges. One reason for doing so is to attempt to avoid creating air pockets within the encapsulated region due to the intersection of fronts of ongoing, moving encapsulation material, drawn by capillary forces. Thus, the amount of time involved in encapsulating relatively large areas may be excessive.

Secondly, it may be difficult to cause the encapsulation to occur within the remote region defined by narrow surfaces without creating air pockets within the region. The air pockets can cause the very problems that encapsulation was intended to overcome. Namely, air pockets may facilitate attack by external contaminants and reduce structural integrity of the encapsulated product.

Thus, there is a need for better ways to encapsulate electronic devices.

DETAILED DESCRIPTION

Figure 1:
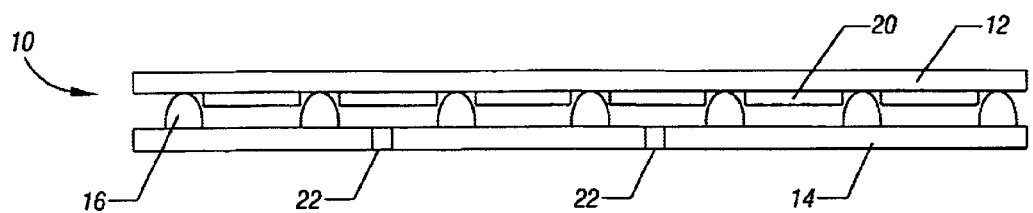
FIG. 1 is an enlarged, cross-sectional view of an electronic device to be encapsulated in accordance with one embodiment of the present invention.

Referring to FIG. 1, an electronic device 10 may, in one embodiment, be a tile or display module for a large area display. In other embodiments, the electronic device 10 may be an electronic integrated circuit being connected to a surface such as a printed circuit board. The electronic device 10, in general, includes a narrow region 11 to be encapsulated.

In the embodiment shown is FIG. 1, a display panel 12 and a back plate 14 define a narrow region 11 to be encapsulated. In one embodiment, that region 11 may be punctuated by interconnects 16, light emitting display elements 20, and other devices that may obstruct the flow of encapsulant into the region 11.

A port 22 may be provided to facilitate the injection of encapsulant. In one embodiment, encapsulation material, rather than being injected at the edges of the electronic device 10 is actually applied through encapsulation injection ports 22 that are defined through the back plate 14. Obviously, the ports 22 must be placed in a position so as not to disrupt the electronic operations of the device 10.

Encapsulant then may be injected into the region 11 until such time as the device 10 is fully encapsulated. While two encapsulation ports 22 are illustrated, in some cases, only a single encapsulation port 22 may be utilized and in some embodiments, a port 22 may be centrally located on the device 10.

In general, it may be advantageous in many embodiments to cause encapsulant to spread outwardly from the center of the device 10 towards its edges. This, in some embodiments, may prevent the formation of air pockets or air bubbles in the encapsulated region 11.

Generally, the encapsulation material is any normally utilized encapsulation material. It may be viscous in some cases. For example, epoxy may be utilized. In general, the encapsulation material is applied as a liquid and eventually hardens to form a tough encapsulation.

Figure 2:
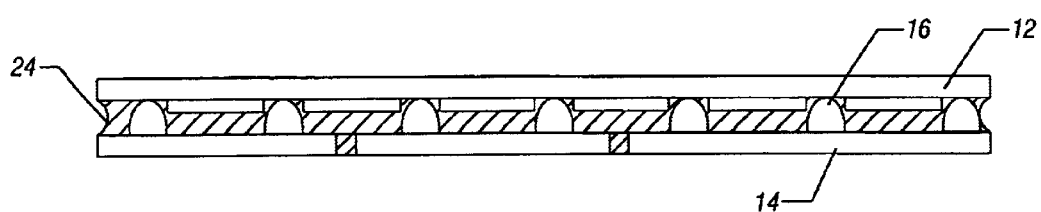
FIG. 2 is a cross-sectional view of the device of FIG. 1 after encapsulation in accordance with one embodiment of the present invention.
Figure 3:
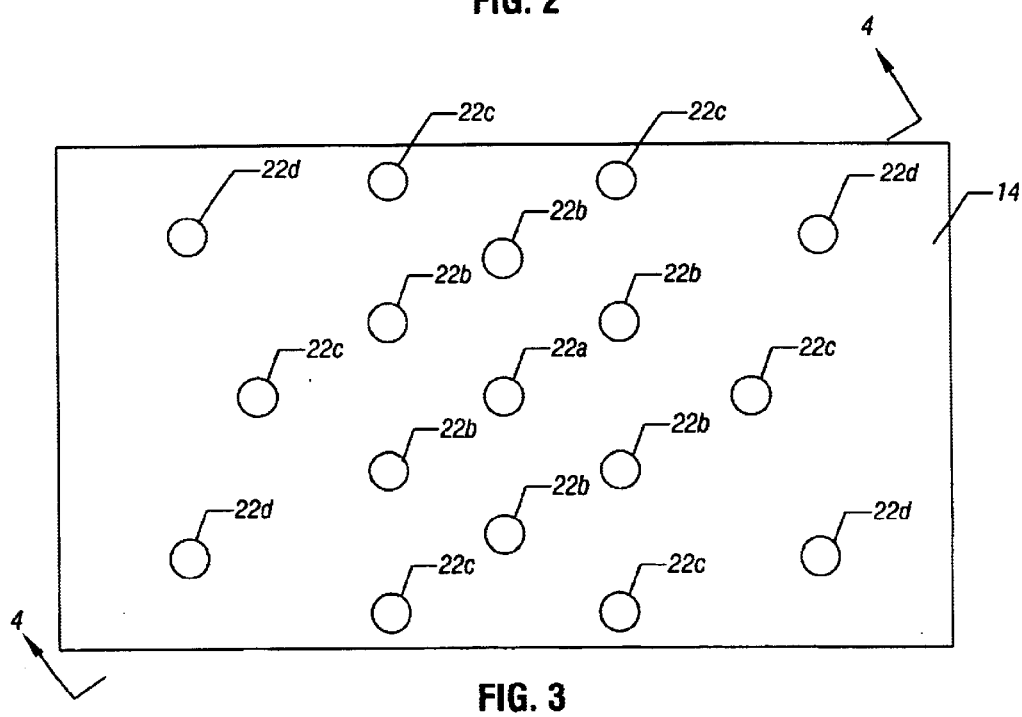
FIG. 3 is a top plan view of the device shown in FIG. 2, in accordance with one embodiment of the present invention.

The completed structure, shown in FIG. 2, includes encapsulation 24, having end portions that may form a meniscus. Encapsulation 24 totally fills the region 11, in one embodiment, and also fills the injection ports 22.

In accordance with one embodiment of the present invention, a plurality of injection ports 22 may be utilized. A central injection port 22a is initially utilized to inject the encapsulation material between the panel 12 and plate 14. Once the encapsulation material begins to appear in a second ring of encapsulation ports 22b, the injection through the port 22a may be stopped and the injection through the ports 22b may begin. Thus, if the port 22a is centrally located on the panel 12 and plate 14, and the ports 22b are radially distributed with respect to the port 22a, a cylindrically advancing front of encapsulant may be provided between the panel 12 and plate 14. This arrangement may reduce the likelihood of forming air bubbles.

Once the encapsulant applied through the ports 22b reaches the ports 22c, the flow of encapsulant through the ports 22b may be stopped. Next encapsulant may be injected through the ports 22c. The ports 22c are radially outwardly displaced from the ports 22b in one embodiment of the present invention. In addition, the ports 22c may be situated along a radius that bisects an arc defined between two adjacent ports 22b. In this way, the occurrence of air pockets or voids may be reduced by continually applying the encapsulant in a progressive fashion in the regions most likely to form voids or air bubbles.

Finally, a fourth ring of encapsulation ports 22d may be utilized to complete the flow of encapsulant in one embodiment. Again the ring of ports 22d is spaced radially outwardly with respect to the ports 22c and situated intermediately with respect to adjacent ports 22c.

Figure 4A:
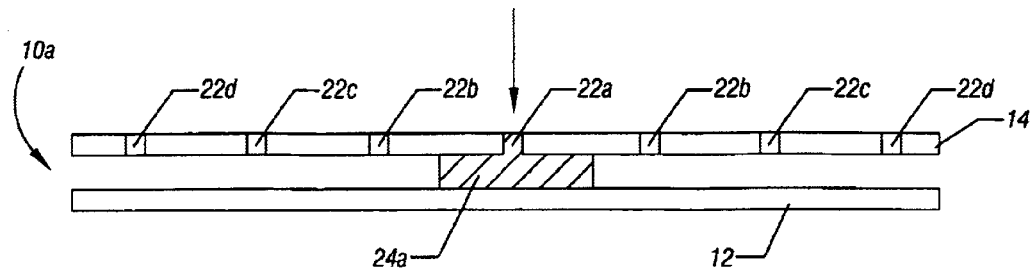
FIG. 4a is a schematic top plan view showing the encapsulation of an electronic device in accordance with one embodiment of the present invention.
Figure 4B:
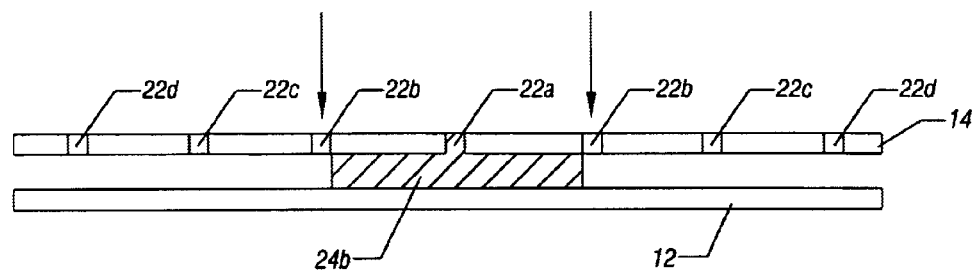
FIG. 4b is an enlarged cross-sectional view corresponding to FIG. 4a at a subsequent stage of encapsulation in accordance with one embodiment of the present invention.

Referring to FIG. 4a, a more generalized embodiment is illustrated. In this example, the electronic device 10a may be a device other than a display. It may include more or less components within the gap region 11. Initially, the encapsulant 24a is injected through a centrally located port 22a and the encapsulant 24a spreads radially outwardly toward the radially outwardly displaced ports 22b. When the encapsulant 24b reaches the ports 22b, as shown in FIG. 4b, the injection of encapsulation through the port 22a is stopped and encapsulation material may be injected through the ports 22b.

Figure 4C:
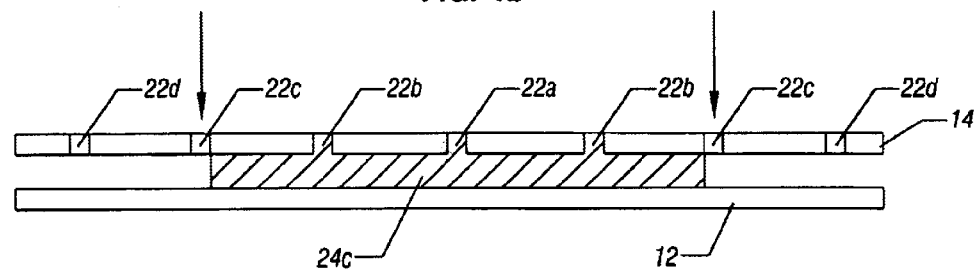
FIG. 4c is an enlarged cross-sectional view corresponding to FIG. 4b at a subsequent stage of encapsulation in accordance with one embodiment of the present invention.
Figure 4D:
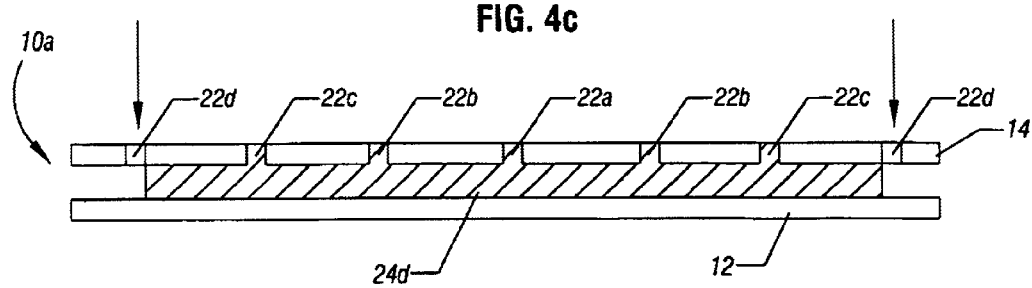
FIG. 4d is an enlarged cross-sectional view corresponding to FIG. 4c at a subsequent stage of encapsulation in accordance with one embodiment of the present invention.

Similarly, that injection is continued until the encapsulation material 24c reaches the ports 22c, at which time injection through the ports 22b is terminated and replaced with injection through the ports 22c, as shown in FIG. 4c. Finally the injection commences through the ports 22d, replacing the flow through the ports 22c when the encapsulant 24d reaches the ports 22d, as shown in FIG. 4d. When encapsulant reaches the peripheral edges of the device 10a, the flow of encapsulant may be terminated.

In some embodiments, injecting encapsulant in a progressive fashion may facilitate the rapid deployment of encapsulation without the provision of air bubbles. In general, the more sources of encapsulant that are provided, the faster the encapsulation may be completed. Particularly with large areas to be encapsulated, the encapsulation time may create a considerable bottle neck in fabrication processing.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

coupling a first and second surface of an electronic device in spaced apart relationship so as to form a region between said first and second surfaces;

forming a centrally located hole in one of said surfaces;

forming a plurality of radially displaced holes arranged at a substantially uniform radius from said centrally located hole; and injecting an encapsulant between said first and second surfaces through said centrally located hole until the encapsulant reaches said radially displaced holes and thereafter stopping the injection of encapsulant through said centrally located hole and injecting encapsulant through said radially displaced holes.

2. The method of claim 1 including forming an electronic display.

3. A method comprising:

injecting encapsulant into an electronic device at a first location; and when the encapsulant reaches a second location spaced from said first location, injecting encapsulant at a location proximate to said second location.

4. The method of claim 3 including coupling a first and second surface of an electronic device and injecting encapsulant between said first and second surfaces.

5. The method of claim 4 including forming a centrally located hole and forming a plurality of radially displaced holes arranged at a substantially uniform radius from said centrally located hole.

6. The method of claim 5 including injecting encapsulant through said centrally located hole until the encapsulant reaches said radially displaced holes and thereafter stopping the injection of encapsulant through said centrally located hole and injecting encapsulant through said radially displaced holes.

7. The method of claim 3 including forming an electronic display.

8. The method of claim 3 including injecting encapsulant into a region between a pair of spaced plates.

9. The method of claim 8 including injecting encapsulant through one of said plates.

10. A method comprising:

forming a centrally located hole in a first surface of an electronic device;

forming a plurality of radially displaced holes arranged at substantially uniform radius from said centrally located hole in a first or a second surface;

coupling the first and second surface of an electronic device; and injecting an encapsulant between said first and second surfaces through said centrally located hole until the encapsulant reaches said radially displaced hole and thereafter stopping the injection from encapsulant through said centrally located hole and injecting encapsulant through said radially displaced holes.

11. The method of claim 10 wherein injecting encapsulant causes encapsulant front to extend outwardly from the center of a region to be encapsulated between said first and second surfaces.

12. The method of claim 10 including forming an electronic display.

13. The method of claim 12 including injecting an encapsulant into a region between a pair of spaced parallel plates.

* * * * *